United States Patent
Foster et al.

(10) Patent No.: US 6,306,707 B1
(45) Date of Patent: Oct. 23, 2001

(54) DOUBLE LAYER HARD MASK PROCESS TO IMPROVE OXIDE QUALITY FOR NON-VOLATILE FLASH MEMORY PRODUCTS

(75) Inventors: John Foster, Mountain View; Yue-Song He; Jiahua Huang, both of San Jose, all of CA (US)

(73) Assignee: Adanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/716,659

(22) Filed: Nov. 20, 2000

(51) Int. Cl.$^7$ .................................................. H01L 21/336
(52) U.S. Cl. ............................................ 438/264; 438/263
(58) Field of Search ................................... 438/264, 265, 438/260, 261, 262, 263, 257, 253

(56) References Cited

U.S. PATENT DOCUMENTS

| | | | |
|---|---|---|---|
| 4,851,361 | * 7/1989 | Schumann et al. | 437/30 |
| 4,935,378 | * 6/1990 | Mori | 437/43 |
| 5,429,970 | * 7/1995 | Hong | 437/43 |
| 6,043,124 | * 3/2000 | Wu | 438/260 |
| 6,117,733 | * 12/2000 | Sung et al. | 438/265 |
| 6,143,608 | 11/2000 | He et al. | 438/264 |

* cited by examiner

Primary Examiner—David Nelms
Assistant Examiner—Thao P. Le
(74) Attorney, Agent, or Firm—Paul J. Winters

(57) ABSTRACT

In the manufacture of an EPROM or EEPROM semiconductor device that includes a core region and a peripheral region, a nitride layer is formed over the core region and peripheral region, and an oxide layer is formed over the nitride layer. A layer of photoresist is provided over the oxide layer and is patterned to expose a portion of the oxide layer overlying the core region. A wet etch step is undertaken to remove the exposed portion of the oxide layer, using the patterned photoresist as a mask, and leaving exposed a portion of the nitride layer overlying the core region. After removal of the photoresist, the exposed portion of the nitride layer is etched by a wet etch step with hot phosphoric acid, using the pattered oxide layer as a mask.

18 Claims, 7 Drawing Sheets

DOUBLE LAYER HARD MASK PROCESS TO IMPROVE OXIDE QUALITY FOR NON-VOLATILE FLASH MEMORY PRODUCTS

BACKGROUND OF THE INVENTION

1. Field of the Invention

This invention relates generally to fabrication of semiconductor devices, and more particularly, to a method of fabricating flash EPROM or EEPROM memory devices.

2. Discussion of the Related Art

U.S. patent application Ser. No. 09/283,308, entitled BARRIER LAYER DECREASES NITROGEN CONTAMINATION OF THE PERIPHERAL GATE REGIONS DURING TUNNEL OXIDE NITRIDATION, filed Mar. 31, 1999, invented by Yue-Song He et al., now U.S. Pat. No. 6,143,608, hereby incorporated by reference, shows and describes a method for avoiding nitrogen contamination of peripheral gate regions during formation of EPROM and EEPROM memory devices. Several steps representative of that process and relevant to the current invention are shown in FIGS. 1 and 2.

As shown in FIG. 1, as part of a LOCOS process, a semiconductor structure 20 includes a silicon substrate 22 having spaced-apart field oxide regions 24 formed thereon, with sacrificial oxide layers 26, 27 formed on and overlying the surfaces of the silicon substrate 22 between the adjacent field oxide regions 24. The region 28 defines a core region where a core device, i.e., a memory cell, is to be manufactured, while the region 30 defines a peripheral region where other devices necessary for the operation of the overall structure, such as peripheral transistors and amplifiers, will be formed A nitride layer 32 is deposited over the resulting structure, and a layer of photoresist is provided over the nitride layer and patterned as shown at 34' in FIG. 1. Next, a dry etch step is undertaken, removing the exposed portion of the nitride layer 32, with the patterned photoresist 34' acting as a mask (FIG. 2), leaving nitride layer portion 32 overlying the peripheral region 30. Subsequently, the photoresist 34' is removed, sacrificial oxide layer 26 in the region 28 is removed by wet etching using HF acid, and a tunnel oxide is grown on the exposed silicon. Then, a nitridation step of the tunnel oxide is undertaken, to improve reliability of the tunnel oxide, as is well-known. During this step, the remaining nitride 32' overlying the peripheral region 30 provides protection of the underlying area of silicon from nitrogen contamination.

Typically, in such a process, the sacrificial oxide 26 is on the order of 400 angtroms thick. However, as process and product development continue, and devices continue to be reduced in size, modern processes may require a sacrificial oxide thickness on the order of for example 100 angstroms.

As is well-known, the typical dry etch process used for removing the nitride layer 32 also removes some of the sacrificial oxide layer 26, since the dry etch process is not highly selective. With the sacrificial oxide layer 26 on the order of only 100 angstroms thick, it is difficult to protect the surface of the silicon beneath the sacrificial oxide layer 26 during that etch step, which leads to undesirable damage to the silicon lattice, in turn leading to problems in formation and operation of the memory device.

Additional problems arise when the device is a silicon trench isolation (STI) structure. FIG. 3 illustrates a structure 40 similar to that shown in FIG. 1, but showing an STI structure 40 rather that a LOCOS structure. A silicon substrate 42 has spaced apart oxide regions 44 formed therein, with sacrificial oxide layers 46, 48 provided on and overlying the exposed surfaces of the silicon between adjacent oxide regions 44. Again, the region 50 is a core region where a memory cell will be formed, and the region 52 is a peripheral region where peripheral devices will be formed. A nitride layer 54 is deposited over the structure thus far described, and a layer of photoresist is patterned as shown at 56' in FIG. 3, leaving exposed a portion of the nitride layer 54 over the core region 50, all as described above with reference to FIG. 1. Similar to the above, a dry etch step is undertaken to remove the exposed portion of the nitride layer 54 (FIG. 4), with the patterned photoresist 56' acting as a mask, leaving nitride layer portion 54' over the peripheral region 52. Again, with the sacrificial oxide 46 being very thin the problems described above with regard thereto arise here also.

It will also be noted that the thickness of the nitride layer 54 over the corner regions 58, 60 where oxide and silicon are adjoined is substantially greater than that over the sacrificial oxide layer 46 (FIG. 3).

With the dry etch being anisotropic, an incomplete etch of the nitride layer generally results, leaving what are referred to as nitride "stingers" 62, 64 in the corner regions 58, 60 (FIG. 4), which can lead to device operation problems. Continuing the dry etch to remove the stringers results in increased consumption of the (initially thin) sacrificial oxide layer 46, increasing the problems described above with regard to the damage of the silicon therebelow. If the thickness of the sacrificial oxide is increased (as at 46A in FIG. 5) in an attempt to deal with this problem, after removal of the nitride stringers 62, 64 by overetch (FIG. 6), when wet etch using HF acid is undertaken to remove the remaining sacrificial oxide layer, some of the adjacent areas of the field oxide regions 44 may also be etched away, causing a corner tinning effect, wherein steps 66, 68 are formed at the intersections of the silicon and the field oxide regions 44 (FIG. 7). This exposes side surfaces of the silicon with a crystal orientation other than (100), while the crystal orientation of the top surface of the silicon is (100), leading to device operational problems in the completed product.

While wet etching of a nitride layer using hot phosphoric acid, rather then dry etching, is a known and effective process, the photoresist used as a mask for the nitride etching step cannot stand up the high temperature and aggressive etch rate involved, leading to failures in the photoresist mask during the wet etching step.

Therefore, what is needed is a process for properly removing the portion of the nitride layer overlying the core region, meanwhile overcoming the problems cited above.

SUMMARY OF THE INVENTION

The present invention is a method of manufacturing an EPROM or EEPROM semiconductor device that includes a core region in which a memory device will be formed, and a peripheral region in which peripheral devices will be formed. A nitride layer is formed over the core region and peripheral region, and an oxide layer is formed over the nitride layer. A layer of photoresist is provided over the oxide layer, and is patterned to expose a portion of the oxide layer overlying the core region. A wet etch step is undertaken to remove the exposed portion of the oxide layer overlying the core region, using the patterned photoresist as a mask, leaving exposed a portion of the nitride layer overlying the core region. The photoresist is then removed.

Rather than a dry etch step being undertaken to remove the exposed portion of the nitride layer, a wet etch step using hot phosphoric acid is undertaken, using the patterned oxide layer as a mask. The wet etch it is highly selective, that is, etch rate of the nitride layer is substantially higher than that of oxide, for example, in the range of 30:1, so that the sacrificial oxide, beneath the oxide layer and protecting the silicon therebelow, is substantially intact, while complete removal of the portion of the nitride layer thereover is achieved. This wet etching step of the nitride layer, being isotropic, can be continued until the stringers associated with STI structures are removed. The problem of steps formed in the STI structure at the adjoining portions of field oxide and silicon is avoided because of the selectivity of this etching step, i.e., the nitride is etched at a substantially greater rate that oxide during this step, so that the field oxide remains substantially intact during this step.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
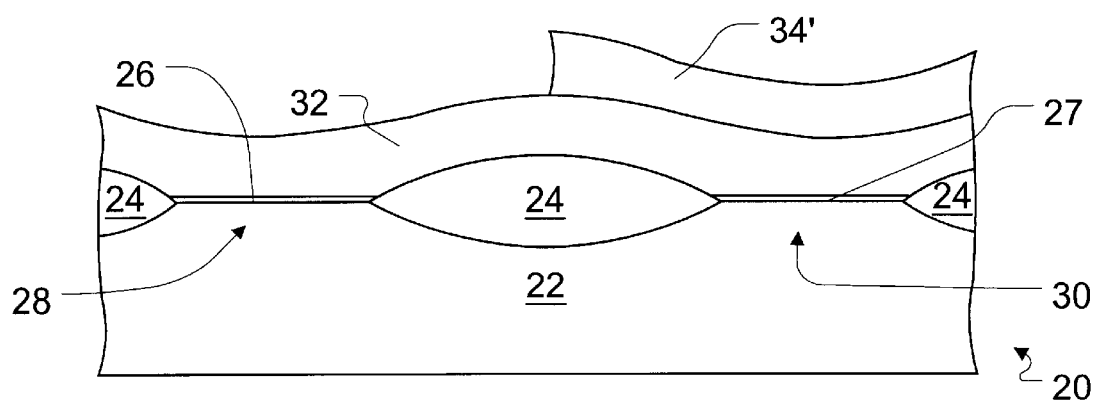
FIG. 1 is a sectional view of a first embodiment of semiconductor structure (LOCOS) illustrating a step in a previous process.
Figure 2:
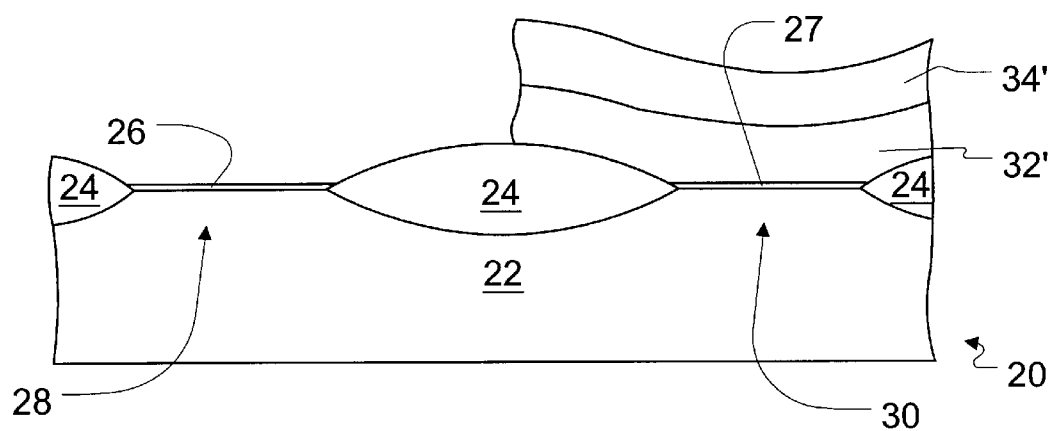
FIG. 2 is a sectional view similar to that shown in FIG. 1, illustrating a further step in the process.
Figure 3:
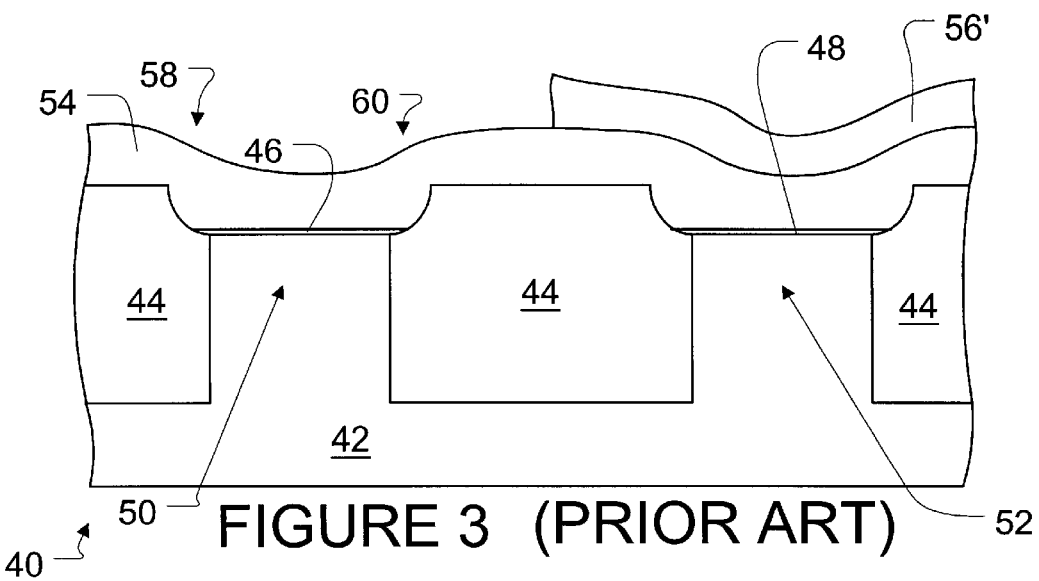
FIG. 3 is a sectional view of a second embodiment of semiconductor structure (STI) illustrating a step in a previous process.
Figure 4:
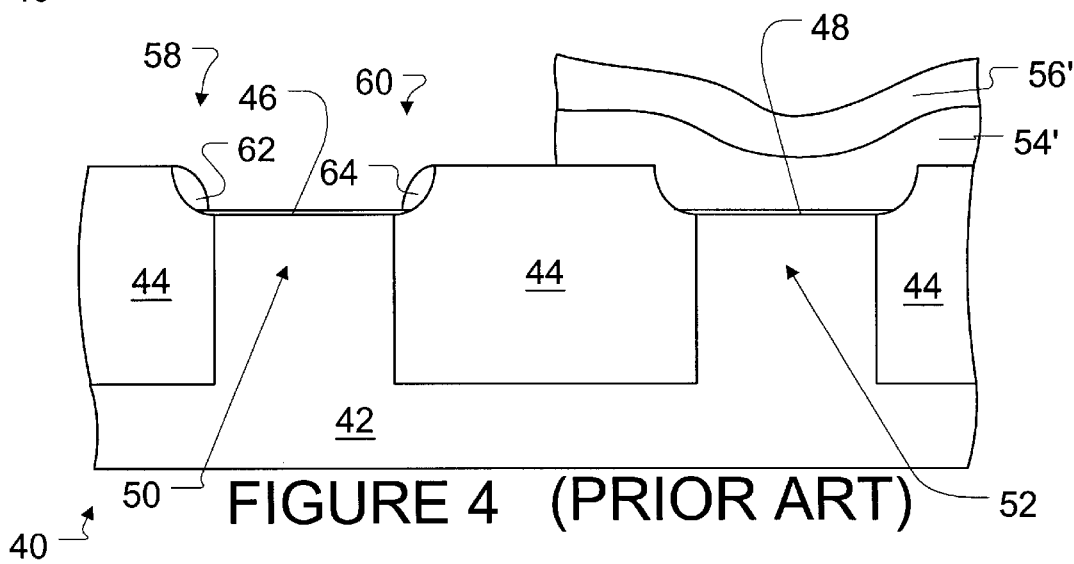
FIGS. 4–7 are sectional views similar to that shown in FIG. 3, illustrating further steps in the process.
Figure 5:
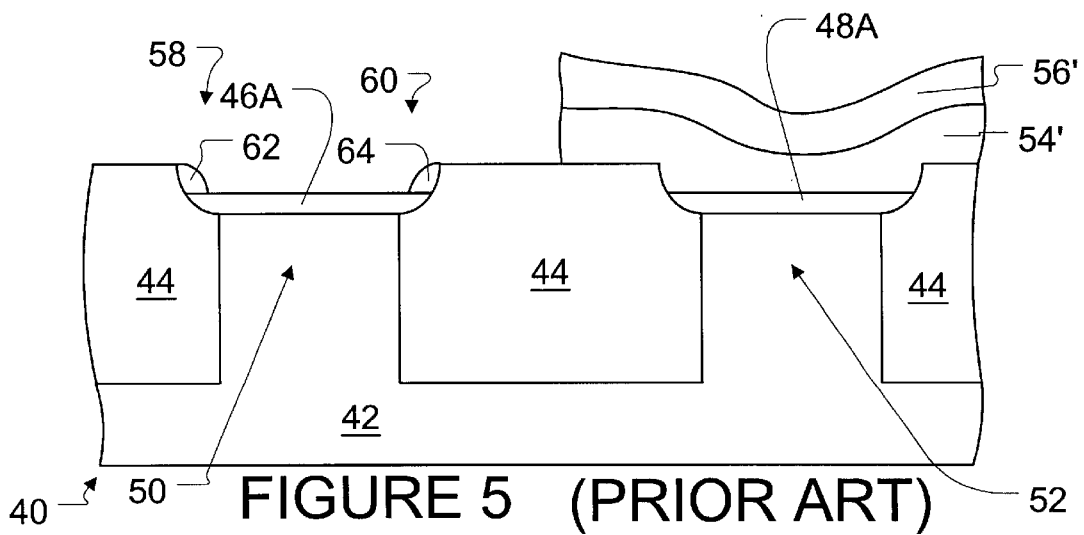
Figure 6:
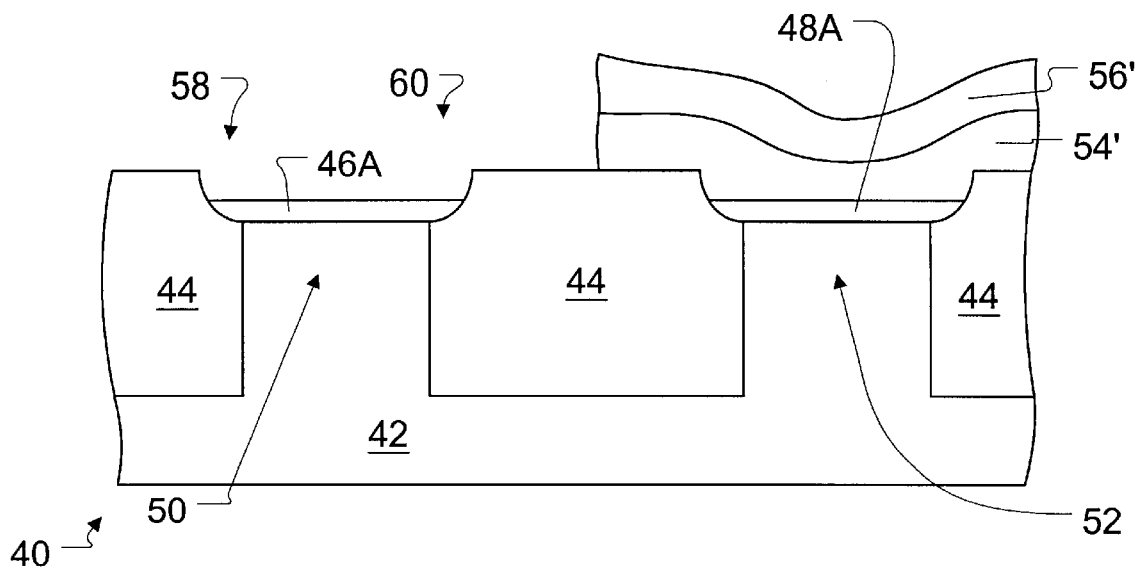
Figure 7:
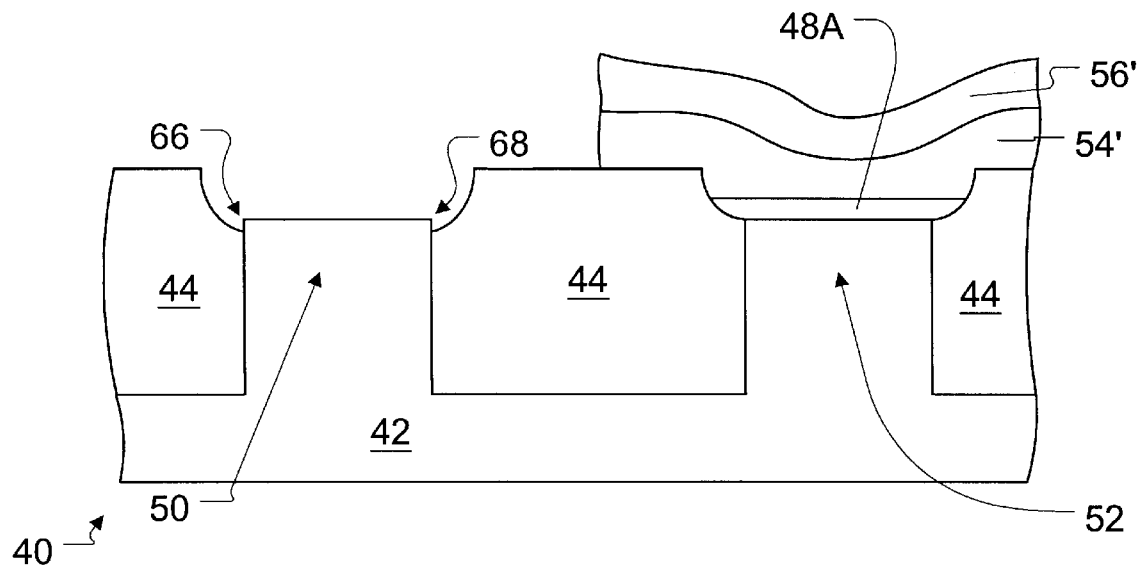
Figure 8:
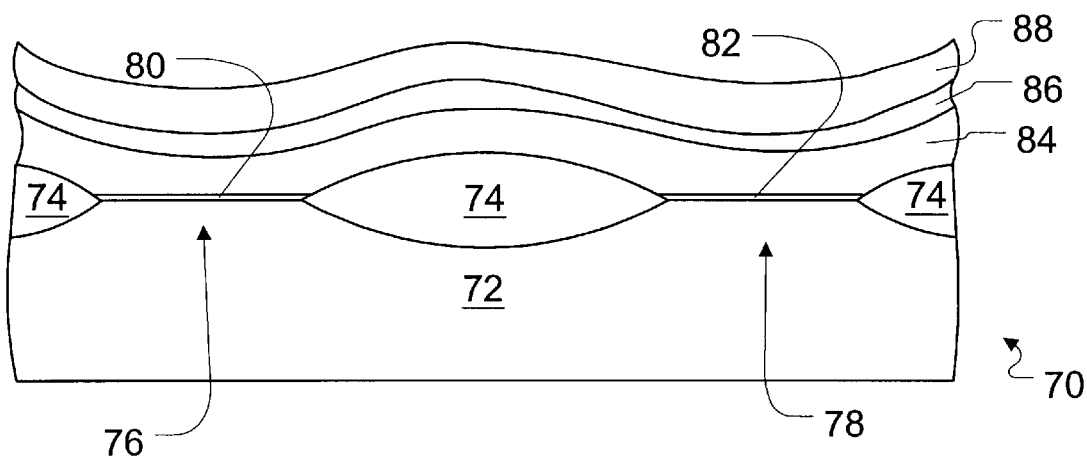
FIG. 8 is a sectional view of a first embodiment semiconductor structure (LOCOS) illustrating a step in the inventive process.

As shown in FIG. 8, as part of a LOCOS process, a semiconductor structure 70 includes a silicon substrate 72 having spaced-apart field oxide regions 74 formed thereon. The region 76 defines a core region where a core device, i.e., a memory cell is to be manufactured, while the region 78 defines a peripheral region where other devices necessary for the operation of the overall structure, such as peripheral transistors and amplifiers, will be formed. A sacrificial oxide is grown to provide sacrificial oxide layers 80, 82 on and overlying the surfaces of the silicon substrate 72 between the adjacent field oxide regions 74, at a thickness of approximately 100 angstroms. Next, a nitride layer 84 approximately 200 angstroms thick is deposited over the resulting structure, and then a layer of silicon dioxide 86, 100 or more angstroms thick, is deposited on top of the nitride layer 84. A layer of photoresist 88 is then provided over the oxide layer 86.

Figure 9:
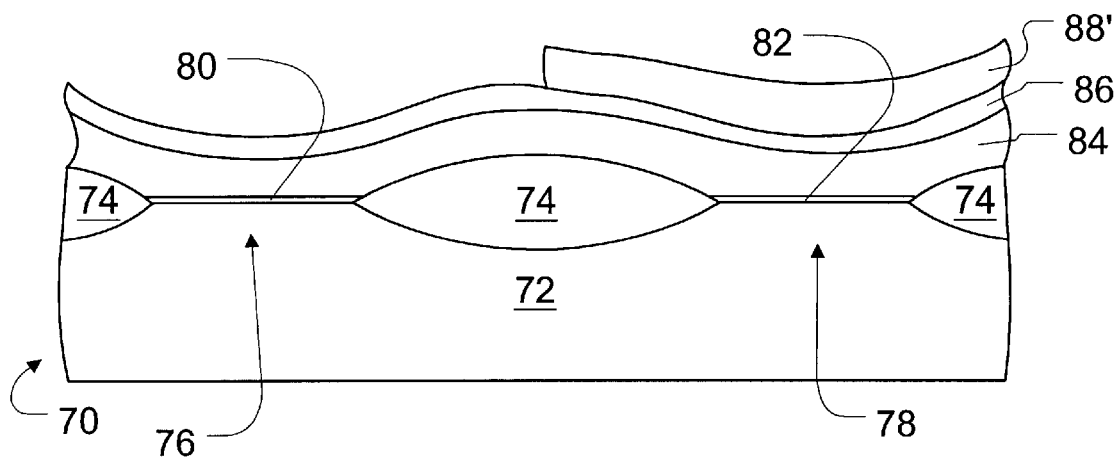
FIGS. 9–13 are sectional views similar to that shown in FIG. 8, illustrating further steps in the inventive process.
Figure 10:
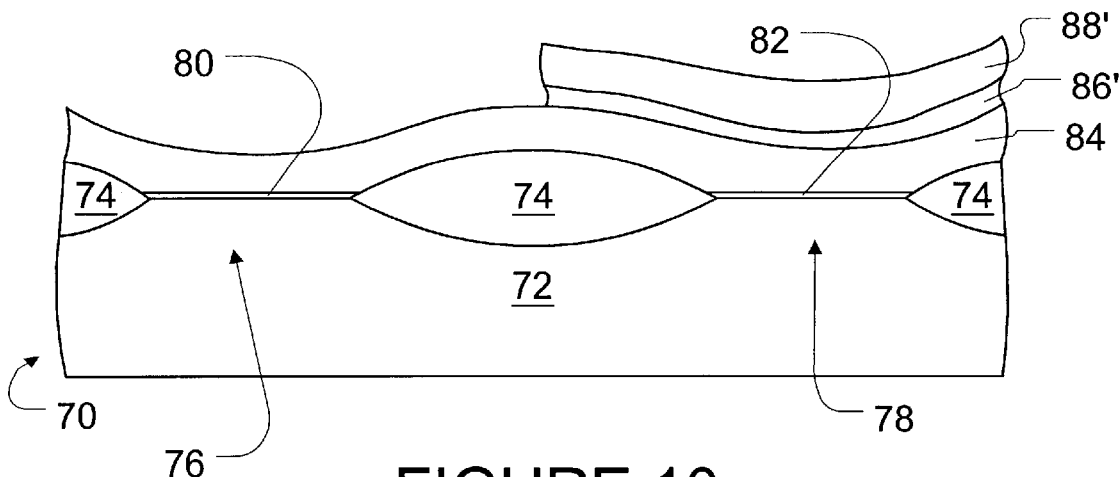
Figure 11:
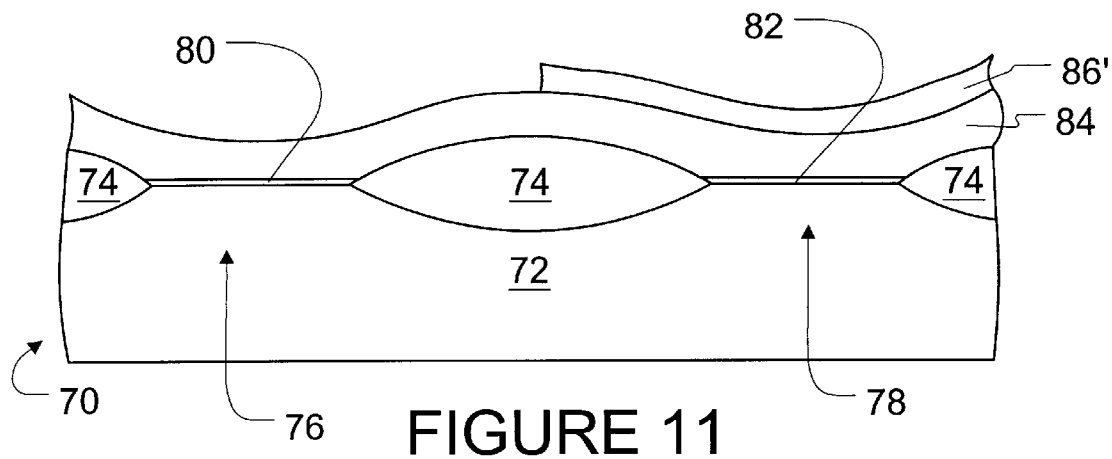

The photoresist layer 88 is then patterned as at 88' to expose a portion of the oxide layer 86 which overlies the core region 76 (FIG. 9). The exposed oxide is then removed by wet etching (FIG. 10), using hydrofluoric (HF) acid as an etchant, to expose a portion of the nitride layer 84 which overlies the core region 76, the remaining portion 86' of the oxide layer overlying the peripheral region 78. Then, the photoresist 88' is stripped away (FIG. 11), and a wafer clearing process is undertaken.

Figure 12:
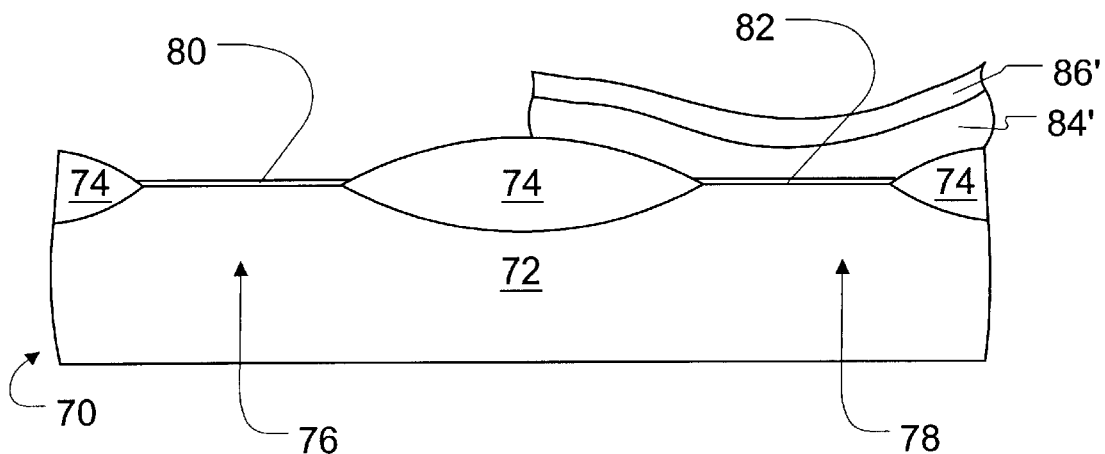
Figure 13:
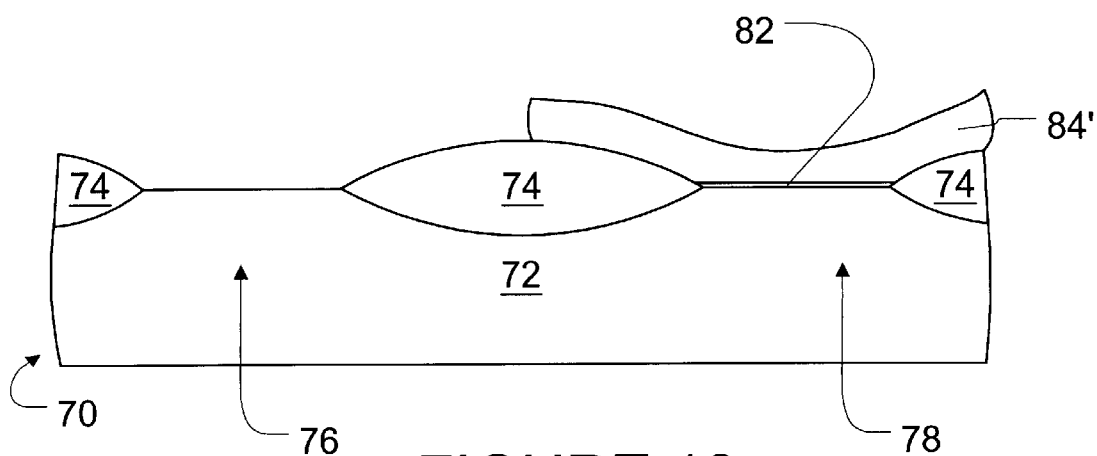

The exposed portion of the nitride layer 84 overlying the core region 76 is removed by wet etching (FIG. 12), using hot (approx. 180° C.) phosphoric acid as an etchant, using the remaining portion 86' of the oxide layer 86 as a mask. The remaining nitride layer portion 84' overlying the peripheral region 78 remains in place, being protected from etching by the remaining portion 86' of the oxide layer acting as a mask.

Because an oxide layer, rather than a photoresist layer, is used as a mask during being of the exposed portion of the nitride layer 84 overlying the core region 76, a wet etch of the nitride 84 can be undertaken using hot phosphoric acid as an etchant, avoiding the problems discussed above with regard to the use of dry etching in the situation, i.e., damage to the silicon lattice in the core region 76. Because of the high selectivity of hot phosphoric acid as an i.e., approximately 30:1 to etch nitride over oxide, as compared to dry etching selectivity of for example 7:1, etching can continue to completely remove the portion of the nitride layer 84 overlying the core region 76, meanwhile leaving the sacrificial oxide layer 80 (and also the remaining portion 86' of the oxide layer 86) substantially unetched and intact. This means that the remaining portion 86' of the oxide layer 86, unlike the photoresist mask described above, continues to properly act as a hard mask for etching of the nitride layer 84 through complete removal of the portion of the nitride layer 84 overlying the core region 76. Meanwhile, upon completion of the removal of that portion of the nitride layer 84 overlying the core region 76, with the sacrificial oxide layer 80 over the core region 76 sub ally intact, the sacrificial oxide layer 80 can now be implanted through, etched away using HF acid as a wet etchant, and a nitride tunnel oxide can be grown. Then, further processing steps are undertaken to complete the structure.

Figure 14:
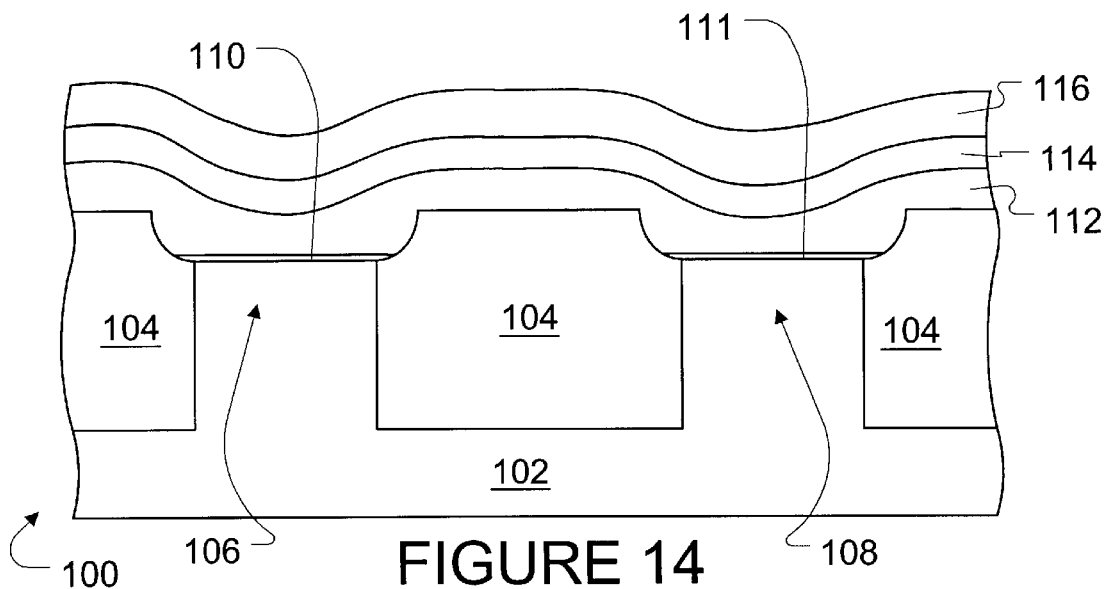
FIG. 14 is a sectional view of a second embodiment of semiconductor structure (STI), illustrating a step in the inventive process.
Figure 15:
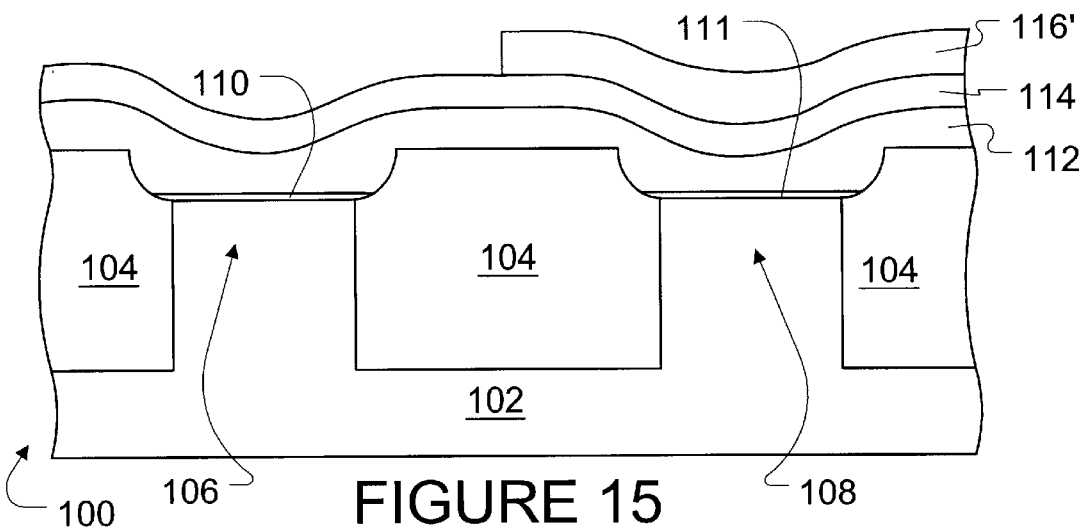
FIGS. 15–19 are sectional views similar to that shown in FIG. 14, illustrating further steps in the inventive process.
Figure 16:
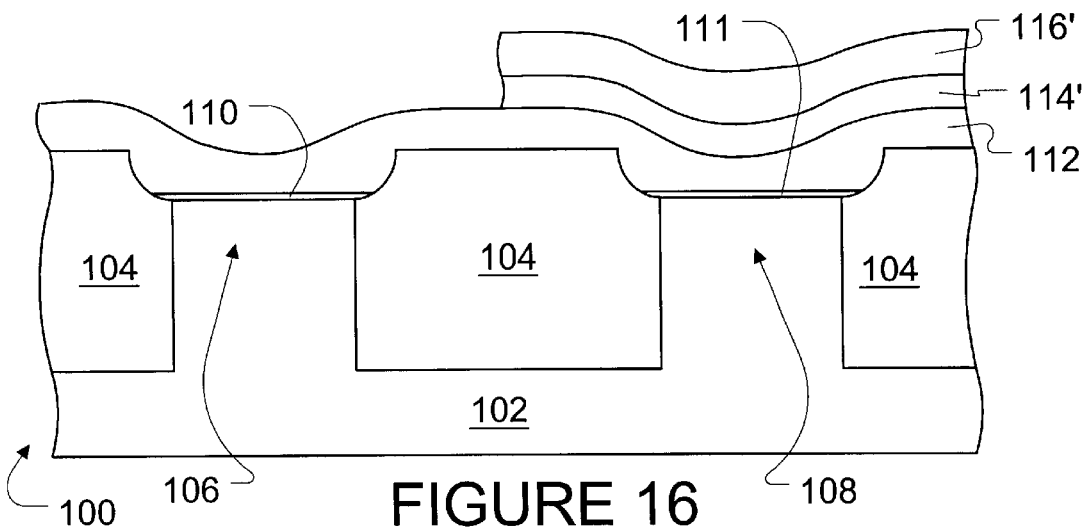
Figure 17:
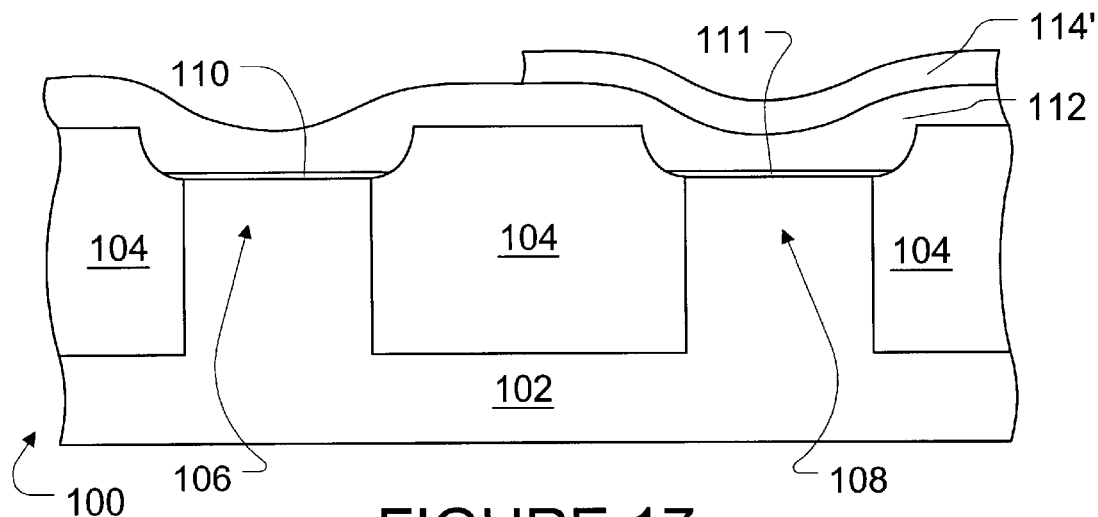
Figure 18:
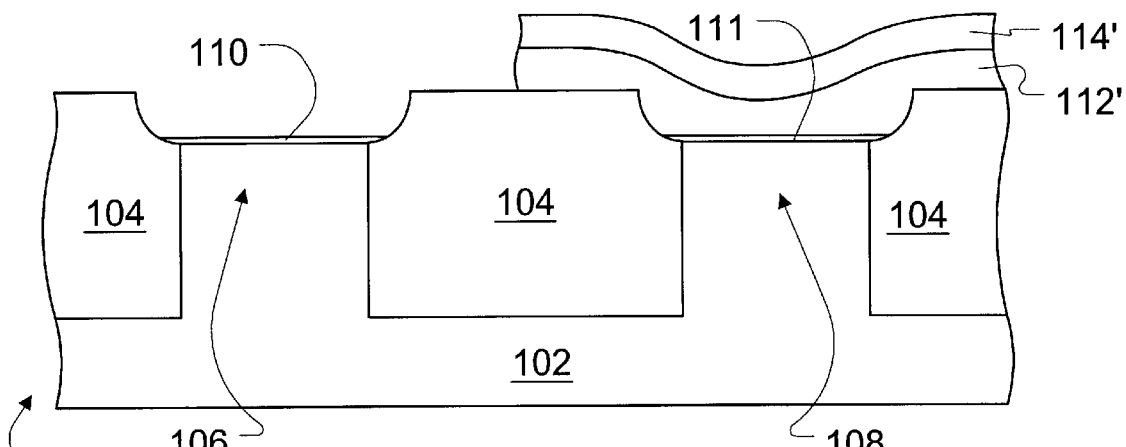

FIG. 14 illustrates a sire 100 similar to that shown in FIG. 8, but showing an STI structure rather than a LOCOS structure. A silicon subtle 102 has spaced-apart oxide regions 104 formed therein, to define a core region 106 where a memory cell will be formed and a peripheral region 108 where peripheral devices will be formed. A sacrificial oxide layer is grown, to form sacrificial oxide layers 110, 111 approximately 100 angstroms thick on and overlying the surfaces of the silicon substrate 102 between the adjacent field oxide regions 104. A nitride layer 112 approximately 200 angstroms thick is deposited over the resulting structure. A silicon dioxide layer 114, 100 angstroms or more, thick is deposited over the nitride layer 112. Next, a layer of photoresist 116 is applied over the nitride layer 112, and is patterned as at 116', FIG. 15, to expose a portion of the oxide layer 114 overlying the core region 106. The exposed portion of the oxide layer 114 is wet etched using HF acid (FIG. 16), and the resist 116' is stripped away, leaving the structure in FIG. 17. The remaining portion 114' of the oxide layer 114 is used as a mask for wet etching the exposed portion of the nitride layer 112 which overlies the core region 106, using hot phosphoric acid as an etchant (FIG. 18). Again, because of the high selectivity of hot phosphoric acid as an etchant, i.e., on the order of 30:1 of nitride over oxide, along with its anisotropic etching characteristic, etching of the exposed portion of the nitride layer 112 can continue until it is completely removed from over the core region 106, avoiding the formation of stringers as described above, and the problems associated therewith, meanwhile leaving the sacrificial oxide layer 110 and portion of the oxide layer 114' substantially intact. Because the thickness of the sacrificial oxide layer 110 does not need to be increased in an attempt to deal with the problem of formation of stringers, as described above, a desirable very thin sacrificial layer thickness, i.e., approximately 100 angstroms thick, can be utilized. Then, when this thin sacrificial oxide layer 110 is etched away in a further processing step, the problem of overetch leading to the corner thinning effect, forming steps between the silicon 102 and field oxide 104 as described above, is avoided.

Figure 19:
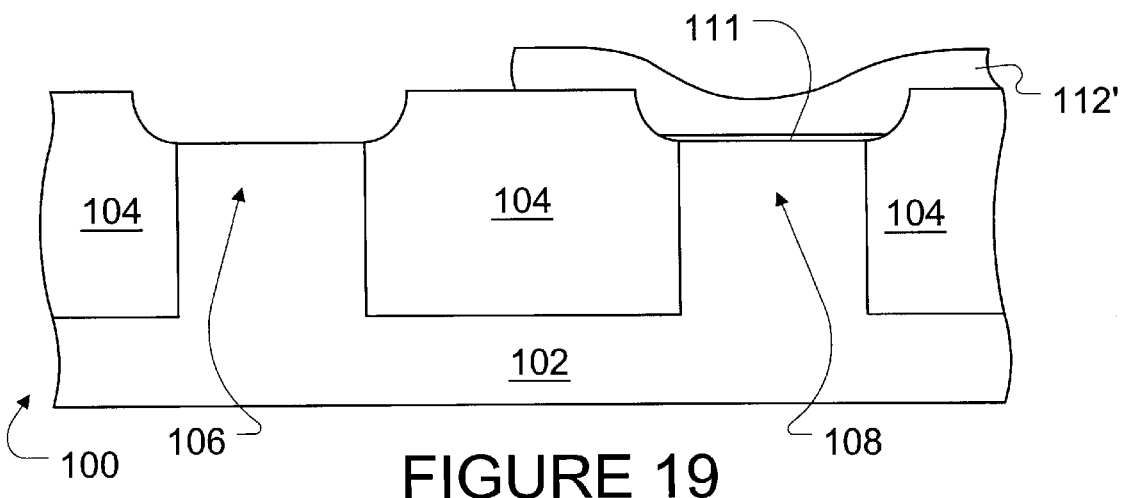

With the sacrificial oxide layer 110 over the core region 106 being substantially intact, the sacrificial oxide layer 110 can then be implanted through, etched away along with oxide layer portion 114'), as shown in FIG. 19, using HF acid as a wet etchant, and a nitride tunnel oxide can be grown. Then, further processing steps can be undertaken to complete the structure.

It will be seen that herein is provided a process for effectively removing the portion of the nitride layer overlying the core region, meanwhile avoiding the problems of previous processes. The method is simple and effective and can be readily practiced with devices of very small dimensions.

The foregoing description of the embodiment of the invention has been presented for purposes of illustration and description. It is not intended to be exhaustive or to limit the invention to the precise form disclosed. Other modifications or variations are possible in light of the above teaching.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of manufacturing a semiconductor device, comprising:
   providing a semiconductor structure having first and second regions;
   providing a nitride layer over the first and second regions;
   providing an oxide layer over the nitride layer;
   providing a photoresist layer over the oxide layer;
   pattering the photoresist layer to expose a portion of the oxide layer overlying the first region;
   removing the exposed portion of the oxide layer overlying the first region, using the patterned photoresist as a mask, leaving exposed a portion of the nitride layer overlying the first region; and
   removing the exposed portion of the nitride layer overlying the first region, using the patterned oxide layer as a mask.

2. The method of claim 1 wherein the exposed portion of the nitride layer is removed by wet etching.

3. The method of claim 2 and further comprising the step of removing the photoresist prior to the wet etching step of the exposed portion of the nitride layer.

4. The method of claim 1 wherein the exposed portion of the oxide layer is removed by wet etching.

5. The method of claim 2 wherein the nitride etch step is undertaken by using hot phosphoric acid as an etchant.

6. The method of claim 5 and further comprising the step of removing the photoresist prior to the wet etching step of the exposed portion of the nitride layer.

7. The method of claim 4 wherein the oxide etch step is undertaken by using HF acid as an etchant.

8. The method of claim 2 and further comprising the step of providing that the semiconductor structure is a LOCOS structure.

9. The method of claim 2 and further comprising the step of providing that the semiconductor structure is an STI structure.

10. The method of claim 2 wherein the first region is a core region and the second region is a peripheral region.

11. The method of claim 1 and further composing the step of providing a sacrificial oxide layer on the first region prior to providing the nitride layer over the first and second regions.

12. The method of claim 6 and further comprising the step of providing a sacrificial oxide layer on the first region prior to providing the nitride layer over the first and second regions.

13. A method of manufacturing a semiconductor device, comprising:
   providing a semiconductor structure having a core region and a peripheral region;
   providing a nitride layer over the core region and peripheral region;
   providing an oxide layer over the nitride layer;
   providing a photoresist layer over the oxide layer;
   patterning the photoresist layer to expose a portion of the oxide layer overlying the core region;
   removing the exposed portion of the oxide layer overlying the core region, using the patterned photoresist as a mask, leaving exposed a portion of the nitride layer overlying the core region;
   removing the photoresist; and
   removing the exposed portion of the nitride layer overlying the core region by wet etching, using the patterned oxide layer as a mask.

14. The method of claim 13 wherein the step of wet etching is undertaken by using hot phosphoric acid as an etchant.

15. The method of claim 14 wherein the step of removing the exposed portion of the oxide layer is undertaken by wet etching using HF acid as an etchant.

16. The method of claim 13 and further comprising the step of providing that the semiconductor structure is a LOCOS structure.

17. The method of claim 13 and further comprising the step of providing that the semiconductor structure is an STI structure.

18. The method of claim 14 and further comprising the step of providing a sacrificial oxide layer on the first region prior to providing the nitride layer on the first and second regions.

* * * * *